United States Patent
Zhong et al.

(10) Patent No.: US 9,382,614 B2
(45) Date of Patent: Jul. 5, 2016

(54) DEFECT REDUCTION IN META-MODE SPUTTER COATINGS

(71) Applicant: Apple Inc., Cupertino, CA (US)

(72) Inventors: John Z. Zhong, Cupertino, CA (US); Sunggu Kang, San Jose, CA (US); Wookyung Bae, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 5 days.

(21) Appl. No.: 14/479,207

(22) Filed: Sep. 5, 2014

(65) Prior Publication Data

US 2016/0068948 A1 Mar. 10, 2016

Related U.S. Application Data

(63) Continuation of application No. PCT/US2014/054297, filed on Sep. 5, 2014.

(51) Int. Cl.
| | |
|---|---|
| *C23C 14/34* | (2006.01) |
| *H01J 37/34* | (2006.01) |
| *C23C 14/58* | (2006.01) |

(52) U.S. Cl.
CPC .......... *C23C 14/5873* (2013.01); *C23C 14/5846* (2013.01); *H01J 37/3488* (2013.01)

(58) Field of Classification Search
CPC ... C23C 14/34; C23C 14/564; H01J 37/3411; H01J 37/3476; H01J 37/3488
USPC ........................ 204/192.12, 298.07
See application file for complete search history.

(56) References Cited

U.S. PATENT DOCUMENTS

| | | | |
|---|---|---|---|
| 4,380,211 A | 4/1983 | Shinohara | |
| 4,525,262 A * | 6/1985 | Class | H01J 37/3405 204/192.12 |
| 6,013,159 A * | 1/2000 | Adams | C23C 14/564 204/192.12 |
| 2001/0040091 A1 | 11/2001 | Khurana et al. | |
| 2006/0272174 A1 | 12/2006 | Hartig | |
| 2010/0218785 A1 | 9/2010 | Green et al. | |
| 2012/0045588 A1* | 2/2012 | DeVito | C23C 14/0042 427/475 |

FOREIGN PATENT DOCUMENTS

| | | |
|---|---|---|
| JP | 57-054269 | 3/1982 |
| JP | 62-056568 | 3/1987 |

OTHER PUBLICATIONS

PCT Application No. PCT/US2014/054297—International Search Report & Written Opinion dated Jun. 29, 2015.

* cited by examiner

*Primary Examiner* — Rodney McDonald
(74) *Attorney, Agent, or Firm* — Downey Brand LLP

(57) ABSTRACT

Sputter deposition systems and methods for depositing film coatings on one or more substrates are disclosed. The systems and methods are used to prevent or reduce an amount of defects within a deposited film. The methods involve removing defect-related particles that are formed during a deposition process from certain regions of the sputter deposition system and preventing the defect-related particles from detrimentally affecting the quality of the deposited film. In particular embodiments, methods involve creating a flow of gas from a deposition region to a particle collection region the sputter deposition system such that the defect-related particles are entrained within the flow of gas and away from the deposition region. In particular embodiments, the sputter deposition system is a meta-mode sputter deposition system.

20 Claims, 7 Drawing Sheets

DEFECT REDUCTION IN META-MODE SPUTTER COATINGS

CROSS-REFERENCE TO RELATED APPLICATIONS

This application is a continuation of International Application No. PCT/US14/54297 with an international filing date of Sep. 5, 2014, entitled "DEFECT REDUCTION IN META-MODE SPUTTER COATINGS", which is incorporated herein by reference in its entirety.

FIELD

This disclosure relates generally to sputter deposition systems and methods. In particular embodiments, meta-mode sputter deposition systems and methods designed for reducing defects are described.

BACKGROUND

Sputter deposition generally involves directing a sputtering gas at a sputter target such that material from the sputter target is ejected onto a substrate as a thin film. One variation of sputter deposition involves use of a meta-mode sputtering system. In meta-mode sputter deposition, material is sputtered onto the substrate in one part of the sputter deposition chamber and then the sputtered-on material is exposed to a reactive gas in another part of the sputter deposition chamber. Meta-mode sputtering systems are typically used to from metal oxides or silicon oxide films on substrates.

One of the problems with meta-mode sputtering systems, as well as sputter deposition systems in general, is that internal chamber walls can become coated with sputtered material. This sputtered material can build up and flake off of the chamber walls as defect-related particles during a deposition process. These defect-related particles can then end up co-depositing with the sputtered-on material onto the substrate and reducing the quality of the resultant film. In a product manufacturing process, this can detrimentally affect quality control and lead to poor production throughput. In some cases it can be difficult to suppress the occurrence of particle defects simply by varying standard process parameters.

SUMMARY

This paper describes various embodiments that relate to sputter deposition systems and methods. In particular embodiments, meta-mode sputter systems and methods are described. The systems and methods described are used to deposit defect-free films on substrates. In particular embodiments, the systems and methods can be used to deposit metal oxide, aluminum oxide, ceramic and other types of films.

According to one embodiment, a sputter deposition apparatus configured to deposit a film on a substrate is described. The sputter deposition apparatus includes a deposition region configured to accommodate the substrate during a deposition process. The deposition region includes a sputter target positioned with respect to the substrate such that a sputter gas directed at the sputter target causes ejection of sputter material from the sputter target. A first portion of the sputter material forms the film on the substrate and a second portion of the sputter material forms defect-related particles. The sputter deposition apparatus also includes a particle removal system configured to remove at least a portion of the defect-related particles from the deposition region by creating a flow of defect-related particles toward a particle collection region of the sputter deposition apparatus during a deposition process.

According to another embodiment, a method of depositing a film on a substrate is described. The method includes directing a sputter gas to a sputter target positioned in a deposition region of a sputter deposition apparatus such that sputter material is ejected from the sputter target. A first portion of sputter material forms the film on a surface of the substrate and a second portion of the sputter material forms defect-related particles. The method also includes removing at least a portion of the defect-related particles from the deposition region by creating a flow of gas toward a particle collection region of the sputter deposition apparatus such that the at least a portion of defect-related particles are entrained in the flow of gas and collected at the particle collection region preventing the defect-related particles from forming defects in the deposited film.

According to a further embodiment, a meta-mode sputter apparatus configured to deposit a film on a substrate is described. The meta-mode sputter apparatus includes a deposition region configured to accommodate the substrate during a deposition process. The deposition region includes a sputter area having a sputter target positioned with respect to the substrate such that a sputter gas directed at the sputter target causes a first portion of sputter material from the sputter target to deposit onto the substrate and a second portion of sputter material from the sputter target to form defect-related particles. The deposition region also includes a reactive gas area configured to expose the first portion of sputter material deposited on the substrate to a reactive gas forming the film. The meta-mode sputter apparatus further includes a particle removal system configured to remove at least a portion of the defect-related particles from the deposition region by creating a flow of defect-related particles toward a particle collection region of the sputter deposition apparatus during a deposition process.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
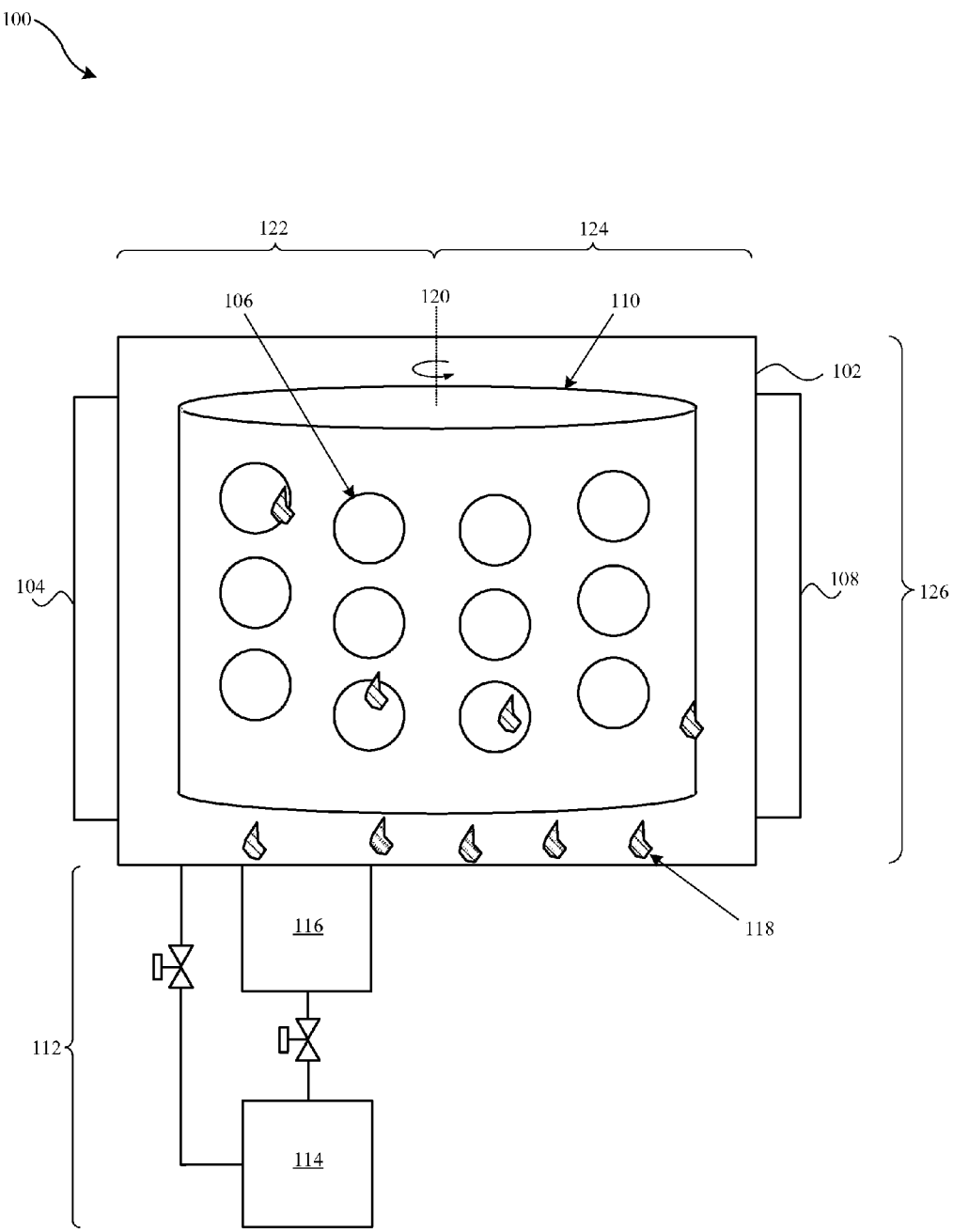
FIG. 1 shows a schematic view of a meta-mode sputter deposition system configured for sputter depositing a thin film.

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

The following disclosure relates to sputter deposition systems and improved methods for depositing films on substrates. In particular, methods described herein can be used to reduce defect-related particles within sputtered-on films. Embodiments described herein relate to modifying and/or adding structural features to a sputter deposition system that reduce the amount defect-related particles from becoming deposited with a desired sputtering material, reducing the occurrence of defects within the resultant deposited film. The structural modifications can remove and isolate defect-related particles away from a deposition region of the sputter deposition system such that the defect-related particles do not interfere with the deposition process. In some embodiments, the structural modifications allow for a flow of gas to be created that drive the defect-related particles to a particle collection region of the sputter deposition system. The defect-related particles can be collected in the particle collection region and cleaned from the particle collection region between deposition processes.

In particular embodiments, a meta-mode sputtering system is described. In meta-mode sputtering systems, the deposition process occurs in two or more processes. For example, a material can be sputtered on a substrate in one region of a meta-mode sputtering system. The sputtered-on material can then be exposed to a reactive gas in another region of the meta-mode sputtering system. The reactive gas can chemically reacts with the sputtered-on material and forms a film containing the desirable final material. Meta-mode sputtering systems are commonly used to deposit metal oxide or ceramic (e.g., silicon dioxide) films. Embodiments described herein can be used to modify meta-mode sputtering systems to reduce the amount of defects in the final film.

Methods described herein are well suited for providing thin films used in the manufacture of portions of electronic devices and electronic device accessories, such as those manufactured by Apple Inc., based in Cupertino, Calif. For example, the methods described herein can be used in the manufacture of electronic displays and/or touch screens for electronic devices and accessories. In particular embodiments, the methods described can be used to form dielectric and/or optical layers or coatings as part of electronic devices.

These and other embodiments are discussed below with reference to FIGS. 1-7. However, those skilled in the art will readily appreciate that the detailed description given herein with respect to these Figures is for explanatory purposes only and should not be construed as limiting.

As described above, methods described herein can be used to reduce defects and improve film quality of thin films produced using sputter deposition systems. In some embodiments, the sputter deposition systems are meta-mode deposition systems. Note that the methods can be adapted for use in any suitable sputter deposition system and are not limited to meta-mode sputter systems.

FIG. 1 shows sputter deposition system 100 configured for sputter depositing a thin film. Sputter deposition system 100 is a meta-mode sputter system that includes chamber 102, sputter target 104, plasma source 108, drum 110 and vacuum system 112. Vacuum system 112 is configured to apply a vacuum within chamber 102 and includes roughing vacuum pump 114 and high vacuum pump 116. Drum 110 is configured to support substrates 106 and is configured to rotate about axis 120 such that substrates 106 can be rotated between sputter area 122 and reactive gas area 124 of sputter deposition system 100. Sputter area 122 and reactive gas area 124 can collectively be referred to as a deposition region 126 of sputter deposition system 100.

During a deposition process, a sputter gas (not shown) is directed to sputter target 104 such that material from sputter target 104 is ejected from sputter target and sputtered onto substrates 106 in sputter area 122. The sputter gas can be any type of suitable reactive gas and can be directed to sputter target 104 at any suitable pressure, as dictated by particular application requirements. In some embodiments, the sputter gas includes ionic species. Sputter target 104 can be made of any suitable sputtering material, including a metal and/or silicon. In some embodiments, sputter target 104 includes an oxidizable material such as one or more oxidizable metal and/or silicon materials.

Drum 110 rotates about axis 120 such that substrates 106 are translated from sputter area 122 to reactive gas area 124 of sputter deposition system 100. Plasma source 108 produces plasma and/or otherwise reactive gas within reactive gas area 124 such that substrates 106 positioned within reactive gas area 124 are exposed to plasma and/or reactive gas. The sputtered-on material on substrates 106 chemically reacts with the reactive gas producing a film having the desired final material. The plasma and/or reactive gas can include any suitable reactive chemical species. For example, the plasma and/or reactive gas can include ions, radicles and/or molecules. In some embodiments, the plasma and/or reactive gas include oxidative species such as reactive species of oxygen, such as oxygen ions, radicles and/or molecules. For example, if the desired material is a metal oxide material, metal material sputtered-on at sputter area 122 can react with an oxidative a plasma and/or reactive gas at reactive gas area 124 forming a metal oxide film on substrates 106. Similarly, if the desired material is a silicon oxide material (e.g., silicon dioxide), silicon material sputtered-on at sputter area 122 can react with an oxidative reactive gas at reactive gas area 124 forming a silicon oxide film on substrates 106. In some cases, the plasma and/or reactive gas can include one or more non-reactive gases as a carrier. In some embodiments, the plasma and/or reactive gas is further activated using radiation, such as microwave radiation.

Once the film having a desired material is formed. In some embodiments, drum 110 is rotated further such that substrates 106 once again enter sputter area 122 and another layer of material is sputtered on the already-formed layer of film. Drum 110 can then be rotated further such that the additional sputtered-on material is reacted with the plasma and/or reactive gas at reactive gas area 124. In this way, a deposition process can include forming a film in one or more layering processes. The thickness of the final film can be partially controlled by the number of rotations of drum 110 and an exposure time of substrates 106 during the deposition process.

During a sputter deposition process, material from sputter target 104 can not only be sputtered onto substrates 106 but can also be sputtered onto other surfaces within chamber 102 and be scattered throughout an internal volume of chamber 102. For example, portions of material can be sputtered onto internal surfaces of chamber 102 and various shields within chamber 102, especially within sputter area 122. This sputtered-on material on internal surfaces of chamber 102 can eventually flake or peel off these internal surfaces in the form of defect-related particles 118 that can become stirred up into and float within the plasma and/or gases within deposition region 126. In addition, portions of material can be sputtered onto surfaces of drum 110. Other portions of sputter material can remain in aerosol form and float within the plasma and/or gases within different portions of chamber 102. In some chamber configurations, gravity pulls larger defect-related particles 118 to bottom surfaces of chamber 102, where the defect-related particles 118 can then be swooped-up again within the flow of plasma and/or gases and into different portions of chamber 102.

The make-up of defect-related particles 118 will depend upon the material of sputter target 104 and the chemical species within the reactive gas. For example, silicon oxide deposition where the sputter target 104 contains silicon and the reactive gas contains oxygen can produce defect-related particles 118 made of silicon and/or silicon oxide materials. Similarly, metal oxide deposition where sputter target 104 contains a metal material and the reactive gas contains oxygen can produce defect-related particles 118 made of metal and/or metal oxide materials. The size of defect-related particles 118 can vary. In some cases, the average size of defect-related particles 118 ranges from about a few micrometers to about a few hundred micrometers in diameter or width.

Defect-related particles 118 are associated with an amount of defects within film formed on substrates 106 that can degrade the quality of the final film. For example, defect-related particles 118 can become co-deposited with material sputtered onto substrates 106 at sputter area 122. Defect-related particles 118 can also cause "pin hole" defects within the deposited film. Alternatively or additionally, defect-related particles 118 can interfere with the chemical reactions taking place within reactive gas area 124. As described above, the meta-mode sputter system 100 includes drum 110 that rotates about axis 120. The rotating action of drum 102 can create turbulence within chamber 102 and further stir up any defect-related particles 118 increasing the amount of defect-related particles 118 floating within chamber 110 and exacerbating the defect problems. If defect-related particles 118 are made of dielectric material (e.g., silicon oxide and metal oxide materials), defect-related particles 118 can cause arcing within chamber 102 during a deposition process, making the deposition process difficult to control and to provide consistent results.

To ameliorate these defect-related particle issues, in some embodiments, sputter area 122 can be separated from reactive gas area 124 using, for example baffles (not shown) that physically isolate sputter area 122 from reactive gas area 124. However, this may not prevent sputter material from building up on and flaking off of surfaces within sputter area 122 in the form of defect-related particles 118. Therefore, other methods can be used to modify sputter deposition system 100 to remove defect-related particles from sputter area 122 and/or reactive gas area 124 during deposition processes.

Figure 2:
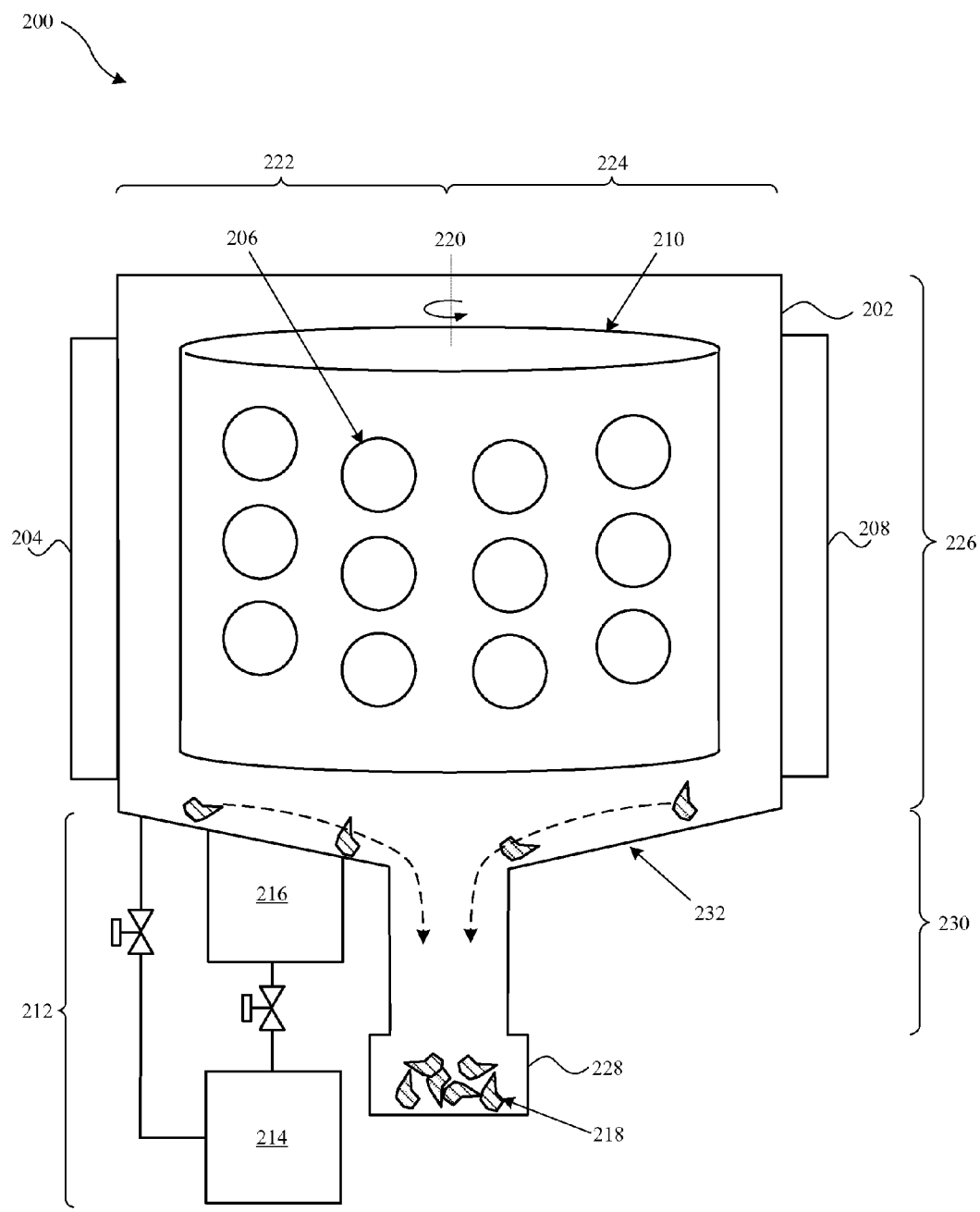
FIG. 2 shows a schematic view of a meta-mode sputter deposition system having a particle collection region and conduit portion for removing and containing defect-related particles from a deposition region of the meta-mode sputter deposition system.

FIG. 2 shows sputter deposition system 200, which includes modifications that can reduce the occurrence of defects related to defect-related particles. Sputter deposition system 200 includes chamber 202, sputter target 204, plasma source 208, drum 210 and vacuum system 212. Chamber 202 includes deposition region 226 where the deposited film is formed. Vacuum system 212 is configured to apply a vacuum within chamber 202, including deposition region 226. In some embodiments, vacuum system 212 includes roughing vacuum pump 214 and high vacuum pump 216. Sputter deposition system 200 is a meta-mode sputter system where deposition region 226 includes sputter area 222 and reactive gas area 224. Drum 210 supports substrates 206 and rotates about axis 220 such that substrates 206 can be rotated between sputter area 222 and reactive gas area 224. It should be noted that the modifications provided herein can be used in any suitable sputter deposition process and are not limited to meta-mode sputter systems. In addition, any number of substrates 206 can be used, including one or more substrates 206.

During a deposition process, a sputter gas (not shown) is directed to sputter target 204 such that material from sputter target 204 is ejected from sputter target 204 and sputtered onto substrates 206 in sputter area 222. In some embodiments, about 1-3 monolayers of sputtered-on material (e.g., 1-3 monolayers of metal or silicon) are sputtered onto substrates 206, corresponding to about 3-10 angstroms thickness. Drum 210 rotates substrates 206 to reactive gas area 224 where plasma source 208 produces plasma and/or other form of reactive gas within reactive gas area 224. The sputtered-on material on substrates 206 is exposed to and chemically reacts with the plasma and/or reactive gas producing a film on substrates 206 having the desired film material. In some embodiments, drum 210 is rotated further such that substrates 206 once again enter sputter area 222 and another layer of material is sputtered on the already-formed layer of film. Drum 210 can then be rotated further such that the additional sputtered-on material reacts with the plasma and/or reactive gas at reactive gas area 224. Drum 210 can continue to rotate so that substrates 206 can undergo deposition for any suitable deposition time, as dictated by particular application requirements.

As described above, material from sputter target 204 can be sputtered onto surfaces within chamber 202 and be scattered throughout an internal volume of chamber 202. This material can flake off in the form of defect-related particles 218 and cause defects within the films deposited on substrates 206. To remove defect-related particles 218 from deposition region 226, sputter deposition system 200 includes particle collection region 228 that is configured to contain defect-related particles 218. According to some embodiments, particle collection region 228 is positioned such that defect-related particles 218 fall toward particle collection region 228 due to the force of gravity. For example, particle collection region 228 can be positioned at a bottom portion of chamber 202 such that the force of gravity creates a flow of defect-related particles 218 away from deposition region 226 toward particle collection region 228. According to some embodiments, sputter deposition system 200 includes conduit portion 230, which provides access to particle collection region 228. As shown, conduit portion 230 can have a narrower diameter than deposition region 226. In some embodiments, funnel shaped portion 232 of conduit portion 230 has a funnel shape that can guide the defect-related particles 218 toward particle collection region 228. For example, defect-related particles 218 can slide down walls of funnel-shaped portion 232 and into particle collection region 228. In some embodiments, substantially all of conduit portion 230 has a funnel shape.

Particle collection region 228 can be cleaned of defect-related particles 218 between one or more deposition process. In some embodiments, particle collection region 228 is configured for easy separation from deposition region 226 between deposition processes for cleaning. For example, particle collection region 228 can be a separable chamber that is attached to chamber 202 with a gasket seal.

Figure 3:
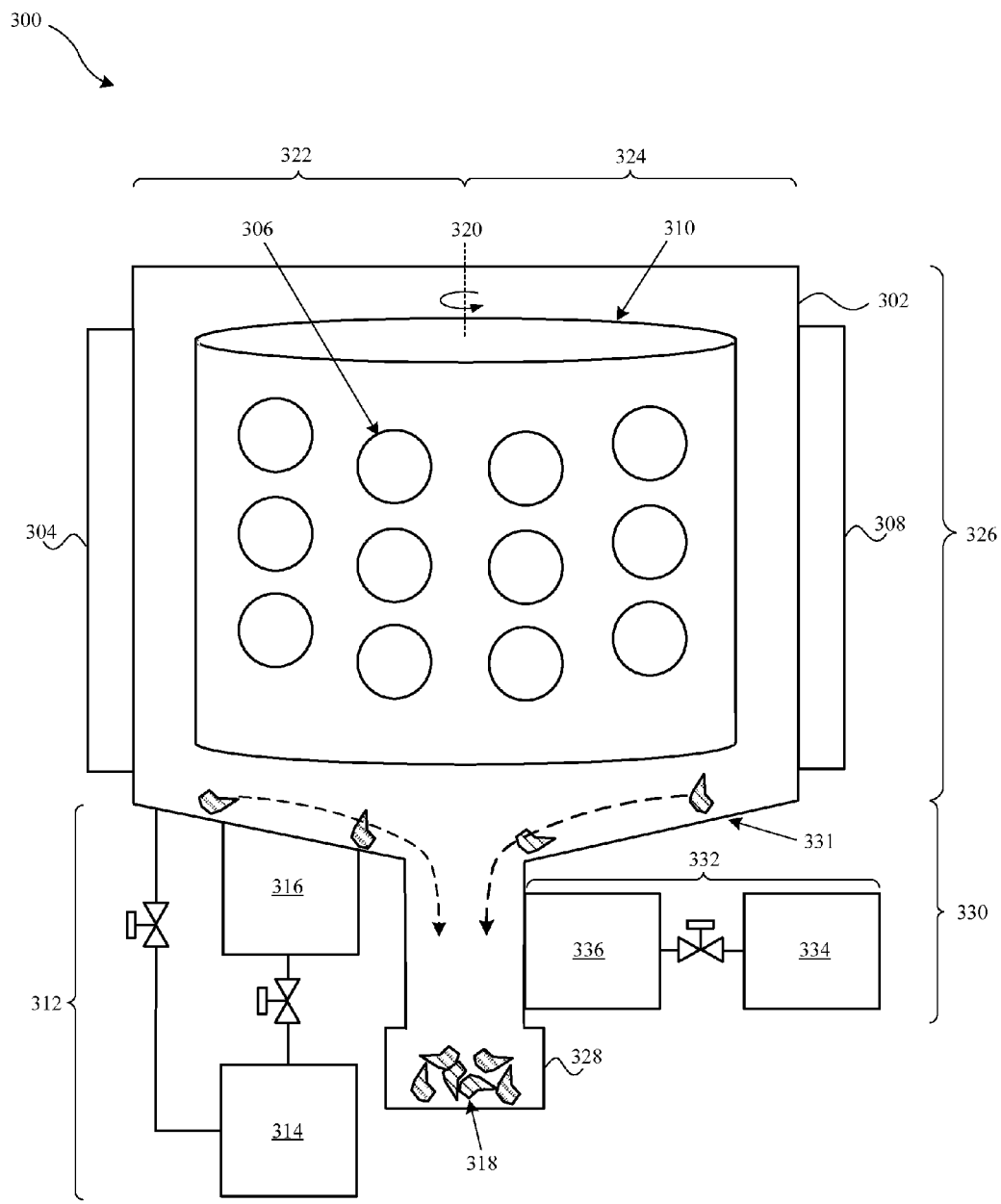
FIG. 3 shows a schematic view of a meta-mode sputter deposition system having a particle collection region, conduit portion and vacuum system for removing and containing defect-related particles from a deposition region of the meta-mode sputter deposition system.

FIG. 3 shows sputter deposition system 300, which includes alternative/additional features that can reduce the occurrence of defects in a deposited film. Similar to systems 100 and 200, sputter deposition system 300 includes chamber 302, sputter target 304, plasma source 308, drum 310 and vacuum system 312 (including roughing vacuum pump 314 and high vacuum pump 316). Deposition region 326 of sputter deposition system 300 includes sputter area 322 and reactive gas area 324. Similar to system 200, sputter deposition system 300 includes particle collection region 328 and conduit portion 330 having funnel shaped portion 331 that can direct defect-related particles 318 toward particle collection region 328. Note, however, that in some embodiments sputter deposition system 300 does not have a conduit portion 330 with funnel shaped portion 331. For example, bottom portion of chamber 302 can have a flat or planar shape, similar to chamber 102 of system 100.

Sputter deposition system 300 includes vacuum system 332, which is configured proximate particle collection region 328 such that a pressure differential is formed between deposition region 326 and particle collection region 328. In particular, vacuum system 332 can pump out and apply more vacuum to particle collection region 328, and/or regions proximate to particle collection region 328 such as conduit portion 330, compared to deposition region 326. That is, the pressure within particle collection region 328 and surrounding areas such as conduit portion 330 will be lower than the pressure within deposition region 326. Per Bernoulli's principle, the decreased pressure at and/or near particle collection region 328 causes gas, with defect-related particles 318 entrained therein, to accelerate toward particle collection region 328. This can create or increase an already existing flow of defect-related particles 318 away from deposition region 326 toward particle collection region 328. Vacuum 332 can include any suitable mechanism for creating a vacuum, including one or more vacuum pumps. In some embodiments, vacuum system 332 includes roughing pump 334 and high vacuum pump 336.

Figure 4:
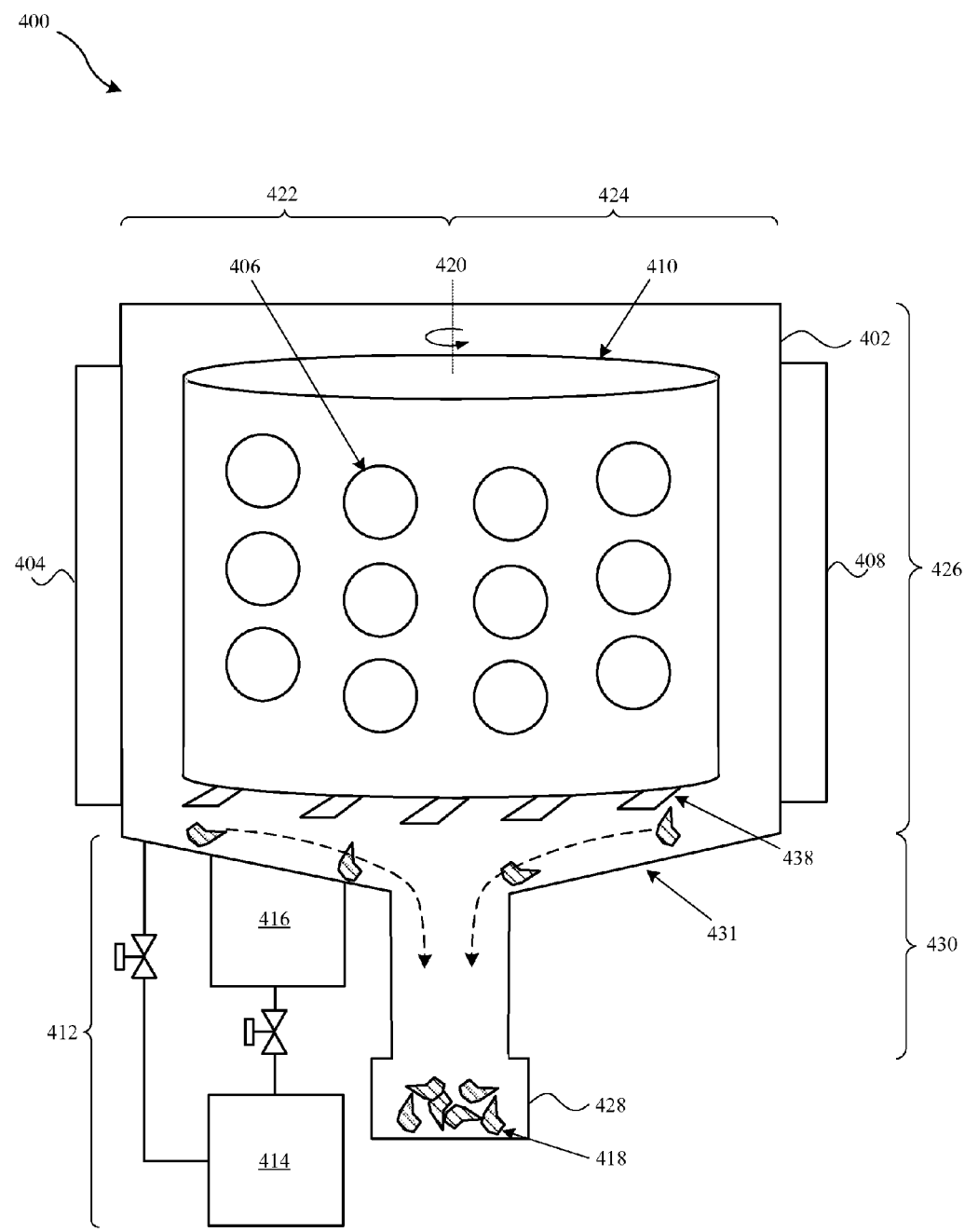
FIG. 4 shows a schematic view of a meta-mode sputter deposition system having a particle collection region, conduit portion and impellor for removing and containing defect-related particles from a deposition region of the meta-mode sputter deposition system.

FIG. 4 shows sputter deposition system 400, which includes alternative/additional features that can reduce the occurrence of defects in a deposited film. Similar to systems 100, 200 and 300, sputter deposition system 400 includes chamber 402, sputter target 404, plasma source 408, drum 410 and vacuum system 412 (including roughing vacuum pump 414 and high vacuum pump 416). Deposition region 426 of sputter deposition system 400 includes sputter area 422 and reactive gas area 424. Similar to systems 200 and 300 sputter deposition system 400 includes particle collection region 428 and conduit portion 430 having funnel shaped portion 431 that can direct defect-related particles 418 to particle collection region 428. Note that in some embodiments sputter deposition system 400 does not have conduit portion 430 with funnel shaped portion 431. For example, bottom portion of chamber 402 can have a flat or planar shape, similar to chamber 102 of system 100.

Sputter deposition system 400 also includes an impeller that creates or adds to the flow or downdraft of gas and defect related particles 418 toward particle collection region 428. In particular, one or more blades 438 are coupled to drum 410, which rotates in order to move substrates 406 between sputter area 422 and reactive gas area 424 during a deposition process. In this way, blades 438 will rotate in accordance with the rotation of drum 410, acting as an impeller or fan that creates or adds to the flow of gas from deposition region 426 toward particle collection region 428. Defect-related particles 418 can become entrained in this flow of gas and become contained within particle collection region 428. Blades 438 can be attached to any suitable portion of drum 410. For example, blades 438 can be attached to a bottom portion of drum 410 proximate particle collection region 428, such as shown in FIG. 4. In some embodiments, blades 438 are attached to a different portion of drum 410. In other embodiments, one or more separate impellers or fans (not shown) are positioned within deposition region 426 that provide a flow of gas with defect-related particles 418 toward particle collection region 428.

Figure 5:
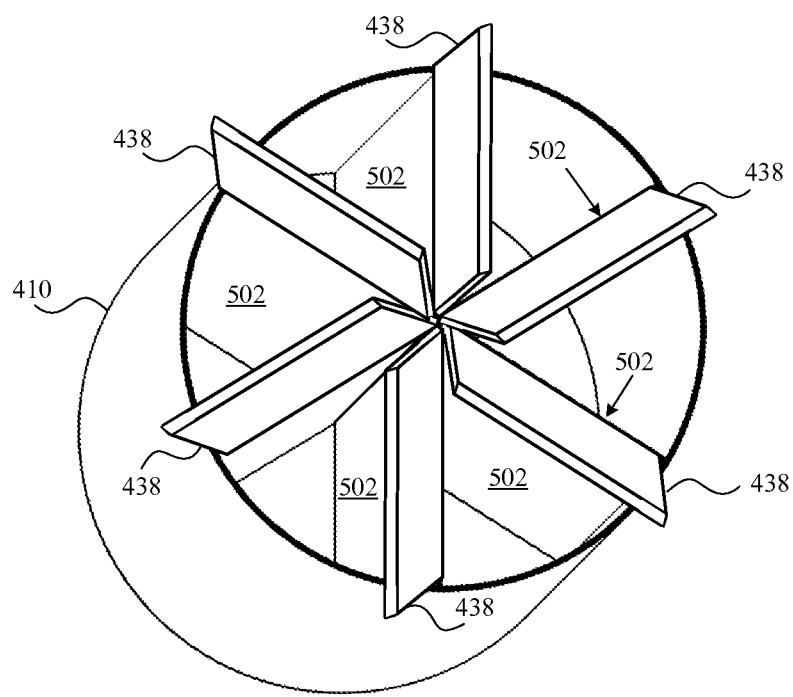
FIG. 5 shows a perspective view of a drum with blades from the meta-mode sputter deposition of FIG. 4.

FIG. 5 shows a perspective view of drum 410 having blades 438 attached thereto. Blades 438 can be added on as extensions to panels 502, which are rigid structures arranged within drum 410 to provide structural support to drum 410. That is, panels 502 can be arranged within drum 410 to provide and maintain a shape to drum 410, and as such can be referred to collectively as a skeletal structure for drum 410. Blades 438 can be integral extensions of panels 502 or can be added to panels 502 as separate extension pieces. Blades 438 can have any suitable shape and have any suitable length/width, depending on design choice and process requirements. In some embodiments, blades 438 are shaped and sized to maximize unidirectional flow toward particle collection region 428. For example, blades 438 can each have a curved shape or substantially planar shape. Blades 438 can be coplanar with each corresponding panel or blades 438 can be set at angles relative to blades 438. In the embodiment shown in FIG. 5, drum 410 includes five blades 438. It should be understood, however, that any suitable number of blades 438 can be used. In some cases, the number of blades 438 will depend upon the number of panels 502 of drum 410. In some cases, the number of blades 438 will depend upon the resultant flow efficiency. In some embodiments, only one blade 438 is used.

Figure 6:
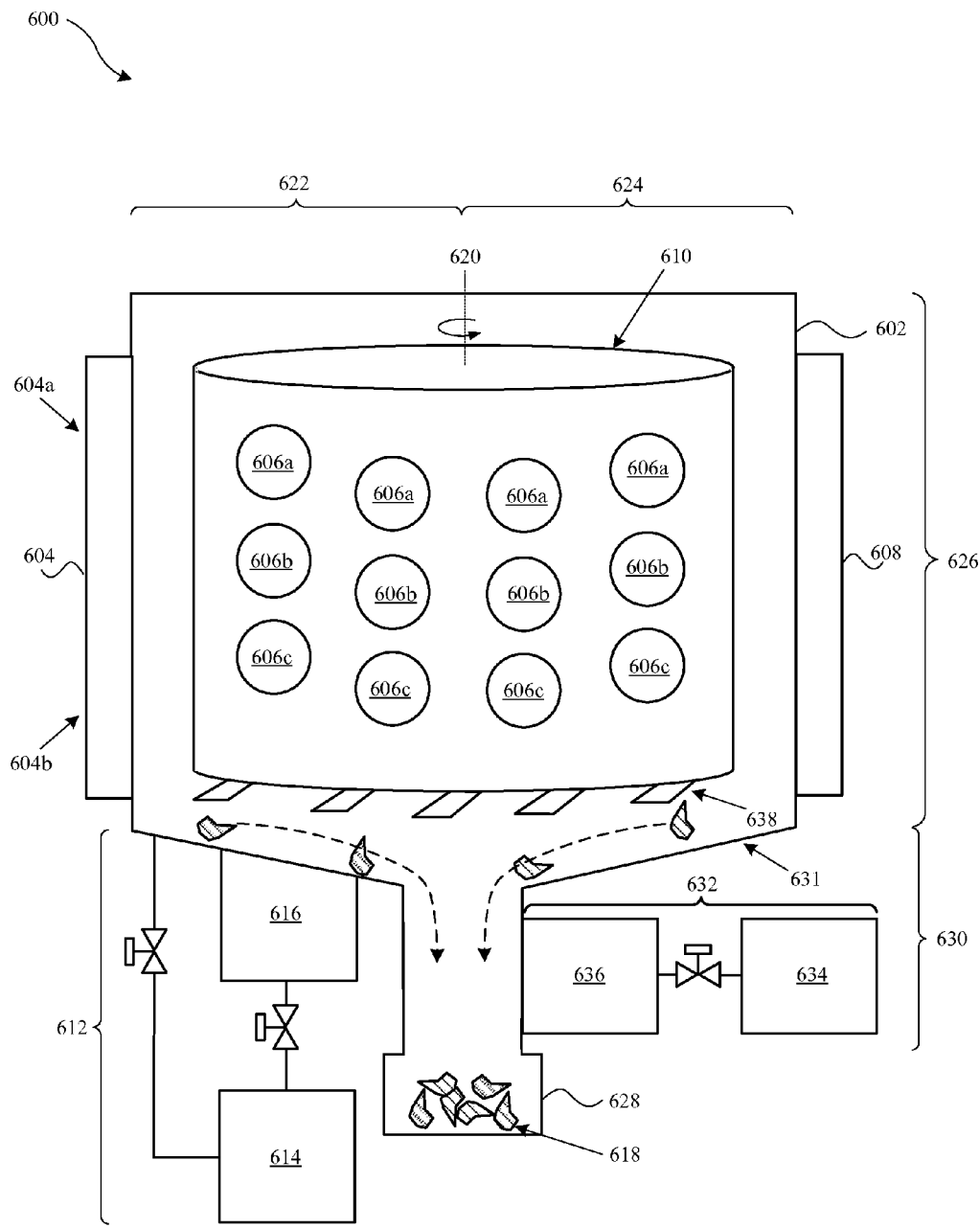
FIG. 6 shows a schematic view of a meta-mode sputter deposition system having a particle collection region, conduit portion, vacuum system and impellor for removing and containing defect-related particles from a deposition region of the meta-mode sputter deposition system.

FIG. 6 shows sputter deposition system 600, which includes a combination of aspects of sputter deposition systems 100, 200, 300 and 400 described above. Similar to systems 100, 200, 300 and 400, sputter deposition system 600 includes chamber 602, sputter target 604, plasma source 608, drum 610 (configured to rotate about axis 620) and vacuum system 612 (including roughing pump 614 and high vacuum pump 616). Deposition region 626 includes sputter area 622 and reactive gas area 624. Sputter deposition system 600 includes a combination of features that together can create a flow of gas and defect-related particles 618 away from deposition region 626 during a deposition process. In particular, sputter deposition system 600 includes particle collection region 628, conduit portion 630 (with funnel shaped portion 631), vacuum system 632 (including roughing pump 634 and high vacuum pump 636) and blades 638. In some cases, the combination of these different features provides optimal removal of defect-related particles 618 from deposition region 626 and the fewest amounts of particle-related defects on substrates 606a-606c.

Note that while the addition of one or more of conduit portion 630 (with funnel shaped portion 631), vacuum system 632 and blades 638 can create a flow of gas that drives defect-related particles 618 to particle collection region 628, in some cases, this same flow of gas can change the working conditions during a sputter deposition process. For example, the flow of gas away from sputter area 622 can cause less sputter material to be present for sputtering onto substrates 606a-

606c. In particular, less sputter material may be sputtered onto substrates 606c compared to substrates 606a and 606b since substrates 606c are closer to particle collection region 628 compared to substrates 606a and 606b. In addition, the flow of gas away from reactive gas area 624 can pull away more of the reactive gas for reacting with the material sputtered onto substrates 606a-606c. In particular, less reactive gas may be available for reacting with material sputtered onto substrates 606c compared to substrates 606a and 606b. Thus, the flow of gas that pulls defect-related particles 618 away from deposition region 626 can cause non-uniform deposition and/or reaction at substrates 606a-606c, and in particular, less deposition and/or reaction at substrates 606c compared to substrates 606a and 606b. This can result in substrates 606c having a thinner film than the film formed on substrates 606a and 606b.

To compensate for the potential non-uniform deposition and/or reaction, in some cases it may be beneficial to change the process parameters during a deposition process. For example, more or less sputter material (by way of an amount of sputter gas) and/or reactive gas than normally used can be introduced. The amount of sputter material and/or reactive gas can be tuned to compensate for a corresponding amount of non-uniform deposition and/or reaction. Alternatively or in addition to changing the amount of sputter material and/or reactive gas, portions of sputter target 604 and/or substrates 606a-606c can be masked during a deposition process. For example, a mask (not shown) can be placed on portion 604a of sputter target 604 to lessen the amount of material sputtered onto substrates 606a and 606b to approximate the relatively lesser amount of material sputtered onto substrates 606c. In this way, the process conditions can be tuned such that the film formed on substrates 606c have a thickness that is substantially the same as a thickness of the film formed on substrates 606a and 606b. Similar modifications can be implemented in embodiments where only one substrate is used to assure that the resultant film has a substantially uniform thickness across a surface of the substrate.

Figure 7:
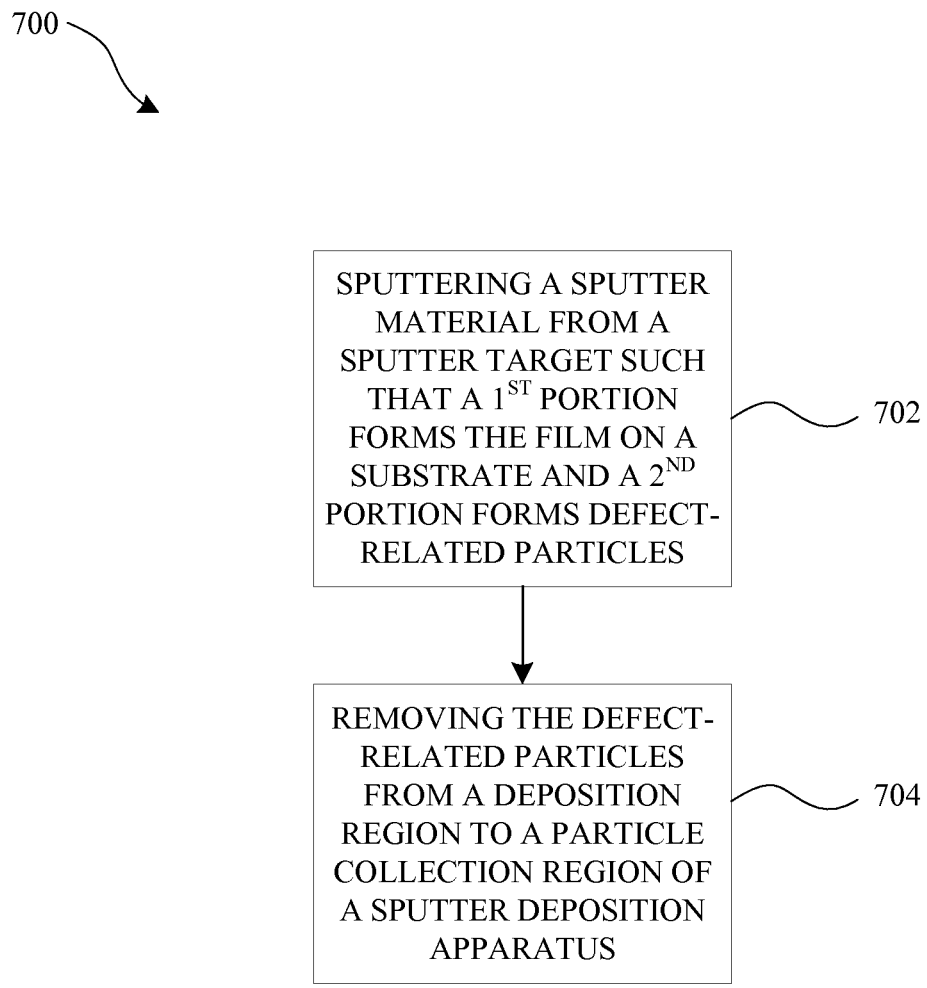
FIG. 7 shows a flowchart indicating a high-level process for sputter depositing a film on a substrate using methods described herein.

FIG. 7 shows flowchart 700, which indicates a high-level process for sputter depositing a film on a substrate using methods described herein. The sputter deposition process can be performed using any suitable sputter deposition system, including a meta-mode sputter deposition system. At 702, a sputter material is sputtered from a sputter target such that a first portion of the sputter material forms a film on the substrate and a second portion of the sputter material forms defect-related particles. If the sputter deposition system is a meta-mode sputter deposition system, the first portion the sputter material sputters onto the substrate in a sputter area and reacts with a reactive gas in a reactive gas area of the meta-mode sputter deposition system. The working pressure during the sputter deposition process will depend upon any of a number of variables. Typical working pressures within the sputter deposition region using a meta-mode sputter system ranges within about a few millitorr (mtorr). The thickness of the deposited film will depend on process conditions and a desired final thickness.

The second portion of the sputter material forms defect-related particles by first sputtering onto internal surfaces within the deposition chamber other than the substrate, then by flaking off these internal surfaces in the form of defect-related particles. The make-up of the defect-related particles will depend on the sputter material and the reactive gas(es). In some embodiments, the defect-related particles include a dielectric material, such as a metal oxide and/or a silicon oxide.

At 704, the defect-related particles are removed from the deposition region to a particle collection region of the sputter deposition system. In some embodiments, the particle collection region is positioned such that the force of gravity pulls the defect-related particles to the particle collection region, such as below the deposition region. In some embodiments, the sputter deposition system includes a conduit portion, at least a portion of which has a funnel-shape that allows the defect-related particles to slide down into the particle collection region.

According to some embodiments, the sputter deposition system includes one or more vacuum systems that create pressure differential between the deposition region and the particle collection region of the sputter deposition system. In particular, the vacuum system(s) create less pressure at and near the particle collection region compared to the deposition region, which forces gas and the defect-related particles to accelerate toward the particle collection region. According to some embodiments, the sputter deposition system includes one or more internal impellers (or fans). The impellers have one or more blades that rotate during a deposition process and create a flow (e.g., downdraft) of gas and defect-related particles toward the particle collection region. In some embodiments, the impeller is formed adding one or more blades to a rotating drum of a meta-mode sputter deposition system. The rotating drum supports and rotates one or more substrates from the sputter area to the reactive gas area during a deposition process. The attached one or more blades rotate with the drum creating the flow or downdraft.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A sputter deposition apparatus configured to deposit a film on a substrate, the sputter deposition apparatus comprising:
   a deposition region configured to accommodate the substrate during a deposition process, the deposition region including a sputter target positioned with respect to the substrate such that a sputter gas directed at the sputter target causes ejection of sputter material from the sputter target, wherein a first portion of the sputter material forms the film on the substrate and a second portion of the sputter material forms defect-related particles; and
   an impeller configured to remove at least a portion of the defect-related particles from the deposition region by creating a flow of defect-related particles toward a particle collection region of the sputter deposition apparatus during the deposition process.

2. The sputter deposition apparatus of claim 1, wherein the impeller prevents at least the portion of the defect-related particles in the particle collection region from re-entering the deposition region during the deposition process.

3. The sputter deposition apparatus of claim 1, wherein the sputter deposition apparatus is configured to deposit a metal oxide film or a silicon oxide film on the substrate.

4. The sputter deposition apparatus of claim 1, wherein the sputter deposition apparatus includes at least one vacuum pump arranged to provide a pressure differential.

5. The sputter deposition apparatus of claim 1, wherein the impeller is positioned within the deposition region of the sputter deposition apparatus.

6. The sputter deposition apparatus of claim 1, wherein the sputter deposition apparatus comprises a meta-mode sputter apparatus, wherein the impeller comprises at least one blade coupled with a rotating drum that supports the substrate.

7. The sputter deposition apparatus of claim 1, wherein the sputter deposition apparatus includes a conduit portion, wherein at least part of the conduit portion has a funnel shape that guides the defect-related particles toward the particle collection region.

8. The sputter deposition apparatus of claim 1, wherein the particle collection region is configured to be separated from the deposition region between deposition processes.

9. The sputter deposition apparatus of claim 1, wherein the sputter deposition apparatus comprises a meta-mode sputter apparatus, wherein the deposition region comprises:
a sputter area where the material is sputtered onto the substrate forming a deposited material on the substrate, and
a reactive gas area where the deposited material chemically reacts with a reactive gas forming the film.

10. The sputter deposition apparatus of claim 1, wherein the deposition region is configured to accommodate a plurality of substrates during the deposition process.

11. A method of depositing a film on a substrate, the method comprising:
directing a sputter gas to a sputter target positioned in a deposition region of a sputter deposition apparatus such that sputter material is ejected from the sputter target, wherein a first portion of sputter material forms the film on a surface of the substrate and a second portion of the sputter material forms defect-related particles; and
removing at least a portion of the defect-related particles from the deposition region by rotating an impeller, thereby creating a flow of gas toward a particle collection region of the sputter deposition apparatus such that the at least a portion of the defect-related particles are entrained in the flow of gas and collected at the particle collection region.

12. The method of claim 11, wherein the at least a portion of the defect-related particles are prevented from re-entering the deposition region during a deposition process.

13. The method of claim 11, wherein the defect-related particles collected in the particle collection region are prevented from re-entering the deposition region during a deposition process.

14. The method of claim 11, wherein creating the flow of gas comprises creating a pressure differential between the deposition region and the particle collection region.

15. The method of claim 11, wherein the deposition region has a first average pressure and the particle collection region has a second average pressure lower than the first average pressure.

16. The method of claim 11, wherein the impeller includes at least one blade.

17. The method of claim 11, wherein the flow of gas from the deposition region toward the particle collection region prevents the defect-related particles collected at the particle collection region from re-entering the deposition region during a deposition process.

18. The method of claim 16, wherein the sputter deposition apparatus is a meta-mode sputter apparatus, wherein the at least one blade is coupled with a rotating drum that supports the substrate.

19. The method of claim 11, wherein the flow of gas toward the particle collection region is associated with reducing a uniformity of the film formed on the surface of the substrate, the method further comprising:
prior to directing the sputter gas to the sputter target, masking a portion of sputter target and/or the substrate compensating for the flow of gas such that the film has a substantially uniform thickness.

20. A meta-mode sputter deposition apparatus configured to deposit a film on a substrate, the meta-mode sputter deposition apparatus comprising:
a deposition region configured to accommodate the substrate during a deposition process, the deposition region including:
a sputter area having a sputter target positioned with respect to the substrate such that a sputter gas directed at the sputter target causes a first portion of sputter material from the sputter target to deposit onto the substrate and a second portion of sputter material from the sputter target to form defect-related particles, and
a reactive gas area configured to expose the first portion of sputter material deposited on the substrate to a reactive gas forming the film; and
a particle removal system configured to remove at least a portion of the defect-related particles from the deposition region by creating a flow of defect-related particles toward a particle collection region of the meta-mode sputter deposition apparatus during the deposition process, wherein at least one impeller at least partially creates the flow of defect-related particles.

* * * * *